United States Patent
Lee

(10) Patent No.: US 10,908,674 B2
(45) Date of Patent: Feb. 2, 2021

(54) ELECTRONIC DEVICE AND OPERATING METHOD THEREOF

(71) Applicant: SK hynix Inc., Icheon-si (KR)

(72) Inventor: Sung-Ryong Lee, Hanam-si (KR)

(73) Assignee: SK hynix Inc., Icheon-si (KR)

( * ) Notice: Subject to any disclaimer, the term of this patent is extended or adjusted under 35 U.S.C. 154(b) by 113 days.

(21) Appl. No.: 16/218,980

(22) Filed: Dec. 13, 2018

(65) Prior Publication Data

US 2020/0050254 A1 Feb. 13, 2020

(30) Foreign Application Priority Data

Aug. 13, 2018 (KR) .......................... 10-2018-0094528

(51) Int. Cl.
*H03K 3/00* (2006.01)
*G06F 1/3296* (2019.01)
*G05F 1/10* (2006.01)
*H03K 19/00* (2006.01)

(52) U.S. Cl.
CPC .............. *G06F 1/3296* (2013.01); *G05F 1/10* (2013.01); *H03K 19/0016* (2013.01)

(58) Field of Classification Search
CPC .... H03K 5/12; H03K 19/0016; G06F 1/3296; G05F 1/10
USPC ................................................. 327/112, 170
See application file for complete search history.

(56) References Cited

U.S. PATENT DOCUMENTS

| | | | | |
|---|---|---|---|---|
| 5,539,341 A * | 7/1996 | Kuo | ................ | H03K 19/00384 326/21 |
| 6,320,407 B1 * | 11/2001 | Sakamoto | ........ | H03K 19/00384 326/27 |
| 6,710,617 B2 * | 3/2004 | Humphrey | ........... | H03K 17/164 326/26 |
| 7,075,343 B2 * | 7/2006 | Jiang | ....................... | H02M 1/08 327/108 |
| 7,113,121 B1 * | 9/2006 | Sutardja | ................ | H03M 1/747 341/144 |
| 7,154,315 B2 * | 12/2006 | Kim | ..................... | H03K 17/164 327/170 |
| 2010/0207595 A1 * | 8/2010 | Sato | ................. | H03K 19/01721 323/283 |
| 2011/0291707 A1 * | 12/2011 | Illegems | ........... | H03K 17/08104 327/108 |

FOREIGN PATENT DOCUMENTS

| | | |
|---|---|---|
| KR | 10-0500946 | 7/2005 |
| KR | 10-0579045 | 5/2006 |

* cited by examiner

*Primary Examiner* — Ryan Jager
(74) *Attorney, Agent, or Firm* — Perkins Coie LLP

(57) ABSTRACT

An electronic device includes a resistance element coupled between a supply terminal of a first voltage and an output terminal of an output signal, a driving element coupled between the output terminal of the output signal and a supply terminal of a second voltage, and suitable for operating based on a control signal, and a controller suitable for generating the control signal based on an input signal of the controller to the driving element. The controller drives an output terminal of the control signal with a first driving force during an initial period of a first transition period of the control signal, and drives the output terminal of the control signal with a second driving force different from the first driving force during the remaining period of the first transition period. The initial period is determined depending on a threshold voltage of the driving element.

20 Claims, 2 Drawing Sheets

ELECTRONIC DEVICE AND OPERATING METHOD THEREOF

CROSS-REFERENCE TO RELATED APPLICATIONS

This patent document claims the priority to and benefits of Korean Patent Application number 10-2018-0094528, filed on Aug. 13, 2018, the disclosure of which is incorporated herein by reference in its entirety.

TECHNICAL FIELD

The technology and implementations disclosed in this patent document generally relate to a driver circuit design that can be used in semiconductors and electronic devices.

BACKGROUND

Generally, an electronic device includes an interface circuit for linking two or more circuits to transmit electrical signals from one circuit to another. In transmitting the electrical signals, however, a signal transition time may have an impact on the accuracy of the signal transmission. If the electrical signals transition from low to high or from high to low too quickly in the interface circuit, the electro-magnetic interference (EMI) and electrical over-stress (EOS) may cause unwanted noise. On the other hand, if the electrical signals transition from low to high or from high to low too slowly, circuits that receive the transmitted signals may have difficulties in capturing the signals correctly because of a decrease in the timing margin of the signal. Moreover, as the interface circuit becomes more sensitive, the characteristics of the electronic device may be significantly degraded by power noise generated during the signal transitions. Therefore, the interface circuit needs to be designed in a way that avoid generating power noise during the signal transitions.

The electronic device may include a circuit for controlling the EMI, the EOS, etc., and a circuit associated with the timing margin. These additional circuits, however, may have a negative impact on not only the performance of the electronic but also the manufacturing cost of the electronic device.

For example, an image sensing device generates electrical signals based on a minute amount of light. If the power noise, the EMI, the EOS and the like occur when interface circuits in the image sensing device or between the image sensing device and another electronic device relay or convert the electrical signal, the image quality of the image sensing device deteriorates.

The image sensing device is a sensor that captures images using photosensitive properties of semiconductors. The image sensing device is roughly classified into charge-coupled device (CCD) image sensors and complementary metal-oxide semiconductor (CMOS) image sensors. CMOS image sensors are fabricated based on CMOS integrated circuit fabrication process. This feature of CMOS image sensors makes it possible to integrate both analog and digital control circuits in a single integrated circuit (IC), making CMOS image sensors the most widely used type of image sensor.

SUMMARY

This patent document provides, among others, designs of an electronic device capable of optimizing a transition period of a signal in the signal transitions at the interface circuits.

In one example aspect, the disclosed technology can be implemented to provide an electronic device that includes: a resistance element coupled between a supply terminal of a first voltage and an output terminal of an output signal; a driving element coupled between the output terminal of the output signal and a supply terminal of a second voltage, and suitable for operating based on a control signal; and a controller suitable for generating the control signal based on an input signal, driving an output terminal of the control signal with a first driving power during an initial period of a first transition period of the control signal, and driving the output terminal of the control signal with a second driving power different from the first driving power during the remaining period of the first transition period, wherein the initial period is determined depending on a threshold voltage of the driving element.

The first driving power may be higher than the second driving power.

The controller may include: a main driver suitable for driving the output terminal of the control signal with a third voltage during the first transition period based on the input signal; and a sub driver suitable for driving the output terminal of the control signal with the third voltage during the initial period based on the input signal and the control signal, and being disabled during the remaining period.

The first voltage may include a first high voltage, the third voltage may include a second high voltage, and the first and second high voltages may have the same voltage level or different voltage levels.

The main driver may drive the output terminal of the control signal with the second voltage during a second transition period of the control signal.

The second voltage may include a low voltage.

The controller may further include: a current source coupled between a supply terminal of the third voltage and the driving element.

In another example aspect, the disclosed technology can be implemented to provide an electronic device that includes: a pull-up resistance element coupled between a supply terminal of a first high voltage and an output terminal of an output signal; a pull-down driving element coupled between the output terminal of the output signal and a supply terminal of a low voltage, and suitable for selectively driving the output terminal of the output signal with the low voltage based on a control signal; a main driver coupled between a supply terminal of a second high voltage and the supply terminal of the low voltage, and suitable for driving an output terminal of the control signal with the second high voltage during a first transition period of the control signal and driving the output terminal of the control signal with the low voltage during a second transition period of the control signal, based on an input signal; and a sub driver coupled between the supply terminal of the second high voltage and the supply terminal of the low voltage, and suitable for driving the output terminal of the control signal with the second high voltage during an initial period of the first transition period and being disabled during the remaining period of the first transition period and the second transition period, based on the input signal and the control signal.

The initial period may be determined depending on a threshold voltage of the pull-down driving element.

The first and second high voltages may have the same voltage level or different voltage levels.

The sub driver may include: a detection circuit coupled between the supply terminal of the second high voltage and the supply terminal of the low voltage, and suitable for detecting the initial period based on the control signal and generating a detection signal corresponding to a result of the detection; and a driving circuit coupled between the supply terminal of the second high voltage and the output terminal of the control signal, and suitable for driving the output terminal of the control signal with the second high voltage during the initial period based on the input signal and the detection signal.

The detection circuit may include: a first driving element coupled between the supply terminal of the second high voltage and an output terminal of the detection signal, and suitable for driving the output terminal of the detection signal with the second high voltage based on the control signal; and a second driving element coupled between the output terminal of the detection signal and the supply terminal of the low voltage, and suitable for driving the output terminal of the detection signal with the low voltage based on the control signal.

A threshold voltage of the second driving element may be equal to the threshold voltage of the pull-down driving element.

The driving circuit may include: a first driving element coupled between the supply terminal of the second high voltage and a coupling terminal, and suitable for driving the coupling terminal with the second high voltage based on the input signal; and a second driving element coupled between the coupling terminal and the output terminal of the control signal, and suitable for driving the output terminal of the control signal with the second high voltage based on the detection signal.

The main driver may include: a first driving element coupled between the supply terminal of the second high voltage and the output terminal of the control signal, and suitable for driving the output terminal of the control signal with the second high voltage based on the input signal; and a second driving element coupled between the output terminal of the control signal and the supply terminal of the low voltage, and suitable for driving the output terminal of the control signal with the low voltage based on the input signal.

The electronic device may further include: a current source coupled between the supply terminal of the second high voltage and the main driver.

In another example aspect, the disclosed technology can be implemented to provide an operating method of an electronic device that includes: continuously supplying, by a pull-up resistance element, a first high voltage to an output terminal of an output signal regardless of a control signal; driving, by a main driver and a sub driver, an output terminal of the control signal with a second high voltage during an initial period of a first transition period of the control signal when an input signal transitions from a first voltage level to a second voltage level; driving, by the main driver, the output terminal of the control signal with the second high voltage during the remaining period of the first transition period of the control signal, and disabling the sub driver when the input signal transitions from the first voltage level to the second voltage level; and driving, by a pull-down driving element, the output terminal of the output signal with a low voltage based on the control signal.

The initial period may be determined depending on a threshold voltage of the pull-down driving element.

The first and second high voltages may have the same voltage level or different voltage levels.

The operating method may further include: driving, by the main driver, the output terminal of the control signal with the low voltage during a second transition period of the control signal when the input signal transitions from the second voltage level to the first voltage level; and disabling the pull-down driving element based on the control signal.

In another example aspect, an electronic device including internal circuitry having an output terminal of an output signal includes: a resistance element coupled between a supply terminal of a first voltage and the output terminal of the output signal; a driving element coupled between the output terminal of the output signal and a supply terminal of a second voltage to selectively drive the output terminal of the output signal based on a control signal; and a controller coupled to the driving element provide the control signal generated based on an input signal of the controller to the driving element, the controller driving an output terminal of the control signal with a first driving force during an initial period of a first transition period of the control signal and driving the output terminal of the control signal with a second driving force different from the first driving force during a remaining period of the first transition period. The initial period is determined depending on a threshold voltage of the driving element.

In another example aspect, an electronic device including internal circuitry having an output terminal of an output signal includes: a pull-up resistance element coupled between a supply terminal of a first high voltage and the output terminal of the output signal to increase a voltage at the output terminal of the output signal towards the first voltage; a pull-down driving element coupled between the output terminal of the output signal and a supply terminal of a low voltage to selectively drive the output terminal of the output signal with the low voltage based on a control signal for the pull-down driving element; a main driver coupled between a supply terminal of a second high voltage and the supply terminal of the low voltage to drive an output terminal of the control signal with the second high voltage during a first transition period of the control signal and to drive the output terminal of the control signal with the low voltage during a second transition period of the control signal, based on an input signal of the main driver; and a sub driver coupled between the supply terminal of the second high voltage and the supply terminal of the low voltage to drive the output terminal of the control signal with the second high voltage during an initial period of the first transition period, the sub driver being disabled during the remaining period of the first transition period and the second transition period, based on the input signal of the main driver and the control signal for the pull-down driving element.

In another example aspect, an operating method of an electronic device including a main driver, a sub driver, a pull-up resistance element, and a pull-down driving element, comprising: continuously supplying, by the pull-up resistance element, a first high voltage to an output terminal of an output signal regardless of a control signal; driving, by the main driver and the sub driver, an output terminal of the control signal with a second high voltage during an initial period of a first transition period of the control signal when an input signal transitions from a first voltage level to a second voltage level; driving, by the main driver, the output terminal of the control signal with the second high voltage during the remaining period of the first transition period of the control signal, and disabling the sub driver when the input signal transitions from the first voltage level to the second voltage level; and driving, by the pull-down driving element, the output terminal of the output signal with a low voltage based on the control signal.

In another example aspect, an electronic device including internal circuitry having an output terminal of an output signal includes: a resistance element coupled between a power supply terminal of a power supply voltage for output of signals and the output terminal of the output signal to increase a voltage at the output terminal of the output signal towards the power supply voltage for output of signals; a driving element including an NMOS transistor coupled between the output terminal of the output signal and a ground voltage terminal to produce the output signal based on a control signal; a main driver coupled between a power supply terminal of a power supply voltage for the main driver and the ground voltage terminal to generate the control signal for the driving element; and a sub driver coupled between the power supply terminal of the power supply voltage for the main driver and the ground voltage terminal and including a PMOS transistor coupled to the power supply terminal of the power supply voltage for the main driver to provide additional current drivability when generating the control signal for the driving element. The sub driver includes an NMOS transistor that is coupled between the ground voltage terminal and the PMOS transistor and has the same threshold voltage as the NMOS transistor of the driving element to turn off the PMOS transistor coupled to the power supply terminal when a gate voltage of the NMOS transistor of the driving element reaches its threshold voltage.

Those embodiments and other aspects of the disclosed technology are described in detail in the drawings, the description and the claims.

DETAILED DESCRIPTION

Figure 1:
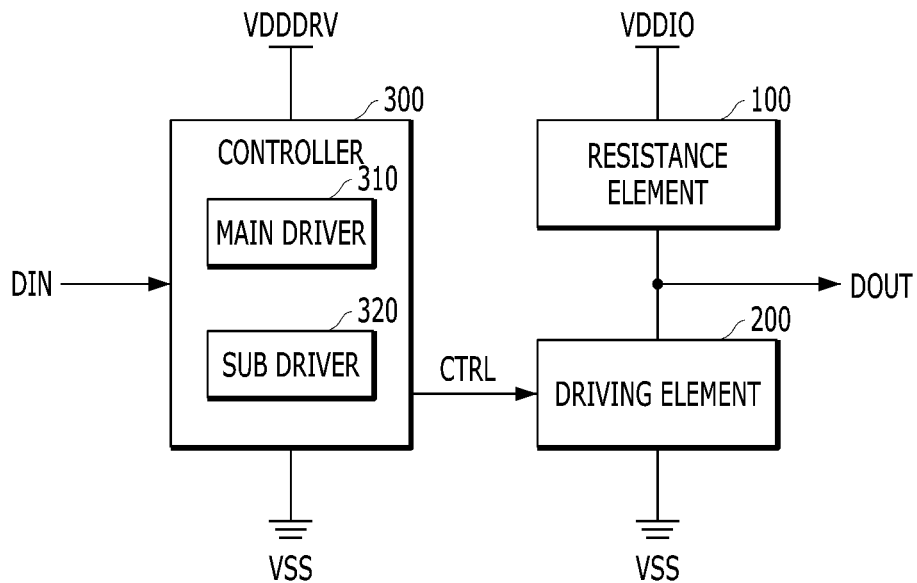
FIG. 1 is a block diagram illustrating an example of an electronic device based on an embodiment of the disclosed technology.

FIG. 1 is a block diagram illustrating an example of an electronic device based on an embodiment of the disclosed technology.

Referring to FIG. 1, the electronic device may include a resistance element 100, a driving element 200, and a controller 300.

The resistance element 100 may be coupled between a supply terminal of a first high voltage VDDIO and an output terminal of an output signal DOUT, which couples the resistance element 100 to the driving element 200. When the driving element 200 functions as a resistor, the output voltage DOUT may be a fraction of the first high voltage VDDIO, resulting from distributing the first high voltage VDDIO between the resistance element 100 and the driving element 200. The resistance element 100 may be used to ensure the first high voltage VDDIO (or a certain voltage lower than the first high voltage VDDIO) across the driving element 200 when the driving element 200 is off. The resistance element 100 may be used to apply a certain high voltage to the output terminal of the output signal DOUT. Thus, the resistance element 100 may serve as a pull-up resistor.

The driving element 200 may be coupled between the output terminal of the output signal DOUT and a supply terminal of a logic low voltage VSS such as a ground voltage. The driving element 200 may operate based on a control signal CTRL. For example, the driving element 200 may selectively drive the output terminal of the output signal DOUT with the low voltage VSS based on the control signal CTRL. In this configuration, the driving element 200 may be used to set or pull the output terminal of the output signal DOUT to the logic low voltage VSS. Thus, the driving element 200 may serve as a pull-down driver.

The controller 300 may be coupled between a supply terminal of a second high voltage VDDDRV and the supply terminal of the low voltage VSS. The second high voltage VDDDRV and the first high voltage VDDIO may have the same voltage level, or alternatively may have different voltage levels. The controller 300 may generate the control signal CTRL based on an input signal DIN.

In some embodiments of the disclosed technology, when the input signal DIN transitions from a first voltage level to a second voltage level, the controller 300 may generate the control signal CTRL based on two different driving forces during a first transition period of the control signal CTRL. For example, the controller 300 may drive an output terminal of the control signal CTRL with a first driving force during an initial period of the first transition period of the control signal CTRL, and may drive the output terminal of the control signal CTRL with a second driving force during the remaining period of the first transition period of the control signal CTRL. The first driving force may be higher than the second driving force. The initial period of the first transition period may be determined according to a threshold voltage of the driving element 200. The first transition period may be a period in which the control signal CTRL transitions from a deactivation level to an activation level. For example, provided that a logic high level is used to activate the driving element 200 and a logic low level is used to deactivate the driving element 200, the control signal CTRL transitions from the logic low level to the logic high level during the first transition period.

On the other hand, when the input signal DIN transitions from the second voltage level to the first voltage level, the controller 300 may generate the control signal CTRL based on a single driving force during a second transition period of the control signal CTRL. The second transition period may be a period in which the control signal CTRL transitions from the activation level to the deactivation level. For example, provided that the logic high level is used to activate the driving element 200 and the logic low level is used to deactivate the driving element 200, the control signal CTRL transitions from the logic high level to the logic low level during the second transition period.

The controller 300 may include a main driver 310, and a sub driver 320. The main driver 310 may drive the output terminal of the control signal CTRL based on the input signal DIN. For example, the main driver 310 may pull the output terminal of the control signal CTRL up to the second high voltage VDDDRV when the input signal DIN is at a low level. Provided, for example, that the input signal DIN at a low level during the first transition period of the control signal CTRL and the input signal DIN at a high level during the second transition period of the control signal CTRL, the main driver 310 may drive the output terminal of the control signal CTRL with the second high voltage VDDDRV during the first transition period of the control signal CTRL, and may drive the output terminal of the control signal CTRL with the low voltage VSS during the second transition period of the control signal CTRL.

The sub driver 320 may be used to ramp up the voltage at the output terminal of the control signal CTRL more quickly. By using the sub driver 320 in combination with the main driver 310, the control signal CTRL may be finely tuned to have a desired waveform. In an embodiment of the disclosed technology, the sub driver 320 may pull the output terminal of the control signal CTRL up to the second high voltage VDDDRV with a higher current drivability. For example, the sub driver 320 may drive the output terminal of the control signal CTRL with the second high voltage VDDDRV using more than one pull-up transistor (e.g., PMOS) during the initial period of the first transition period of the control signal CTRL based on the input signal DIN. The sub driver 320 may be disabled during the remaining period of the first transition period of the control signal CTRL and the second transition period of the control signal CTRL based on the input signal DIN and the control signal CTRL.

Figure 2:
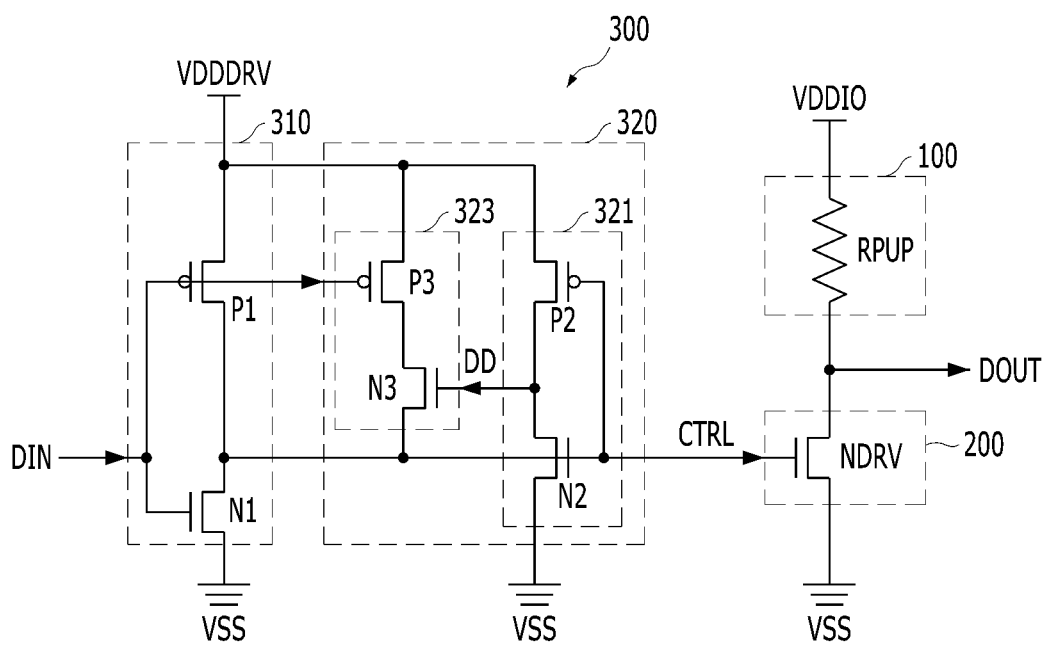
FIG. 2 is a circuit diagram illustrating internal circuitry of the electronic device shown in FIG. 1.

FIG. 2 is a circuit diagram illustrating internal circuitry of the electronic device shown in FIG. 1.

Referring to FIG. 2, the resistance element 100 may include a resistor RPUP coupled between the supply terminal of the first high voltage VDDIO and the output terminal of the output signal DOUT. In representing electrical signals by varying levels, a rise time is the time it takes to increase the level (e.g., voltage level) of a signal from a certain low value to a desired high value. Here, the rise time of the output signal DOUT may vary depending on impedance values of electrical circuits or component coupled to the output terminal of the output signal DOUT including a resistance value of the resistor RPUP.

The driving element 200 may include an NMOS transistor NDRV coupled between the output terminal of the output signal DOUT and the supply terminal of the low voltage VSS. Here, a gate of the NMOS transistor NDRV receives the control signal CTRL to either turn on or off the driving element 200. A fall time is the time it takes to decrease the level of a signal from a certain high value to a desired low value. The fall time of the output signal DOUT may vary depending on impedance values of electrical circuits or component coupled to the output terminal of the output signal DOUT including on-resistance of the NMOS transistor NDRV.

The main driver 310 of the controller 300 may be coupled between the supply terminal of the second high voltage VDDDRV and the supply terminal of the low voltage VSS. The main driver 310 may drive the output terminal of the control signal CTRL with any one of the second high voltage VDDDRV and the low voltage VSS based on the input signal DIN. The main driver 310 may include a first driving element P1 and a second driving element N1.

The first driving element P1 may include a PMOS transistor coupled between the supply terminal of the second high voltage VDDDRV and the output terminal of the control signal CTRL. Here, a gate of the PMOS transistor of the first driving element P1 receives the input signal DIN to either turn on or off the first driving element P1. The first driving element P1 may drive the output terminal of the control signal CTRL with the second high voltage VDDDRV during the first transition period of the control signal CTRL when the input signal DIN transitions from the first voltage level to the second voltage level.

The second driving element N1 may include an NMOS transistor coupled between the output terminal of the control signal CTRL and the supply terminal of the low voltage VSS. Here, a gate of the NMOS transistor of the second driving element N1 receives the input signal DIN. The second driving element N1 may drive the output terminal of the control signal CTRL with the low voltage VSS during the second transition period of the control signal CTRL when the input signal DIN transitions from the second voltage level to the first voltage level.

The sub driver 320 of the controller 300 may be coupled between the supply terminal of the second high voltage VDDDRV and the supply terminal of the control signal CTRL. The sub driver 320 may include a detection circuit 321 and a driving circuit 323.

The detection circuit 321 may be coupled between the supply terminal of the second high voltage VDDDRV and the supply terminal of the low voltage VSS. The detection circuit 321 may detect the initial period of the first transition period of the control signal CTRL based on the control signal CTRL, and may generate a detection signal DD corresponding to a result of the detection. The detection circuit 321 may include a first driving element P2 and a second driving element N2.

The first driving element P2 may include a PMOS transistor coupled between the supply terminal of the second high voltage VDDDRV and an output terminal of the detection signal DD. Here, a gate of the PMOS transistor of the first driving element P2 receives the control signal CTRL to pull up the supply terminal of the control signal CTRL. The first driving element P2 may drive the output terminal of the detection signal DD with the second high voltage VDDDRV based on the control signal CTRL. As discussed below, the first driving element P2, together with another driving element (e.g., P3), may drive with a higher current drivability.

The second driving element N2 may include an NMOS transistor coupled between the output terminal of the detection circuit DD and the supply terminal of the low voltage VSS. Here, a gate of the NMOS transistor of the second driving element N2 receives the control signal CTRL to detect whether the initial period of the first transition period of the control signal CTRL has ended. The second driving element N2 may drive the output terminal of the detection signal DD with the low voltage VSS based on the control signal CTRL. The second driving element N2 may be turned off during the initial period of the first transition period of the control signal CTRL to provide a higher current drivability by operating the sub driver 320, and may be turned on during the remaining period of the first transition period of the control signal CTRL to disable the sub driver 320. In an embodiment of the disclosed technology, a threshold voltage of the second driving element N2 may be designed to be equal to the threshold voltage of the driving element 200.

The driving circuit 323 may be coupled between the supply terminal of the second high voltage VDDDRV and the output terminal of the control signal CTRL. The driving circuit 323 may drive the output terminal of the control signal CTRL with the second high voltage VDDDRV during the initial period of the first transition period of the control signal CTRL based on the input signal DIN and the detection signal DD. In other words, the driving circuit 323 may drive the output terminal of the control signal CTRL with the second high voltage VDDDRV until a voltage level of the output terminal of the control signal CTRL reaches the threshold voltage of the driving element 200. The driving circuit 323 may be disabled during the remaining period of the first transition period of the control signal CTRL (after the initial period of the first transition period of the control signal CTRL) and the second transition period of the control signal CTRL based on the input signal DIN and the detection signal DD. The driving circuit 323 may include a first driving element P3 and a second driving element N3.

The first driving element P3 may include a PMOS transistor coupled between the supply terminal of the second high voltage VDDDRV and a coupling terminal, and a gate which receives the input signal DIN. For example, the first driving element P3 may include a PMOS transistor having a source terminal coupled to the supply terminal of the second high voltage VDDDRV, a drain terminal, and a gate terminal to receive the input signal DIN. The first driving element P3 may drive the coupling terminal with the second high voltage VDDDRV based on the input signal DIN.

The second driving element N3 may include an NMOS transistor coupled between the coupling terminal and the output terminal of the control signal CTRL. Here, a gate of the NMOS transistor of the second driving element N3 receives the detection signal DD. The second driving element N3 may drive the output terminal of the control signal CTRL with the second high voltage VDDDRV during the initial period of the first transition period of the control signal CTRL based on the detection signal DD. In other words, the second driving element N3 may drive the output terminal of the control signal CTRL with the second high voltage VDDDRV until the voltage level of the output terminal of the control signal CTRL reaches the threshold voltage of the driving element 200. The second driving element N3 may be turned on during the initial period of the first transition period of the control signal CTRL, and may be turned off during the remaining period of the first transition period of the control signal CTRL.

Hereinafter, an operation of the internal circuitry of the electronic device implemented based on some embodiments of the disclosed technology will be described with reference to FIG. 3.

Figure 3:
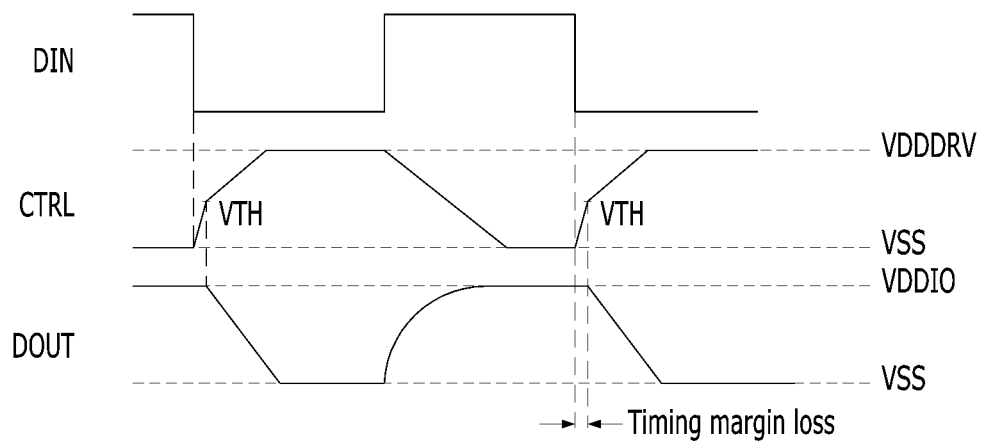
FIG. 3 is a timing diagram for describing an operation of the electronic device shown in FIG. 1.

FIG. 3 is a timing diagram for describing the operation of the electronic device shown in FIG. 1. Referring to the example in FIG. 3, the device may be operated to use the resistance element 100 to continuously supply a certain voltage (e.g., the first high voltage VDDIO or a certain voltage lower than the first high voltage VDDIO) to the output terminal of the output signal DOUT. A certain voltage is applied to the output terminal of the output signal DOUT regardless of the control signal CTRL, but the amplitude of the output signal DOUT may vary depending on the control signal CTRL.

The driving element 200 may selectively supply the low voltage VSS to the output terminal of the output signal DOUT based on the control signal CTRL. For example, when the input signal DIN transitions from the first voltage level (e.g., a logic high level) to the second voltage level (e.g., a logic low level), the driving element 200 may drive the output terminal of the output signal DOUT with the low voltage VSS based on the control signal CTRL. On the other hand, when the input signal DIN transitions from the second voltage level (e.g., the logic low level) to the first voltage level (e.g., the logic high level), the driving element 200 may be disabled based on the control signal CTRL.

When the input signal DIN transitions from the first voltage level (e.g., the logic high level) to the second voltage level (e.g., the logic low level), the control signal CTRL may be generated as follows.

During the initial period of the first transition period of the control signal CTRL, the main driver 310 and the sub driver 320 may simultaneously drive the output terminal of the control signal CTRL with the second high voltage VDDDRV.

During the remaining period of the first transition period of the control signal CTRL, the main driver 310 may drive the output terminal of the control signal CTRL with the second high voltage VDDDRV, and the sub driver 320 may be disabled.

The initial period of the first transition period of the control signal CTRL may be set or determined depending on the threshold voltage of the driving element 200. As the threshold voltage of the second driving element N2 included in the sub driver 320 is designed to be equal to the threshold voltage of the driving element 200, the sub driver 320 may indirectly detect the initial period of the first transition period. Accordingly, the sub driver 320 may be enabled during the initial period of the first transition period, and may be disabled during the remaining period of the first transition period.

When the input signal DIN transitions from the second voltage level (e.g., the logic low level) to the first voltage level (e.g., the logic high level), the main driver 310 may drive the output terminal of the control signal CTRL with the low voltage VSS during the second transition period of the control signal CTRL. Accordingly, the driving element 200 may be disabled based on the control signal CTRL.

Figure 4:
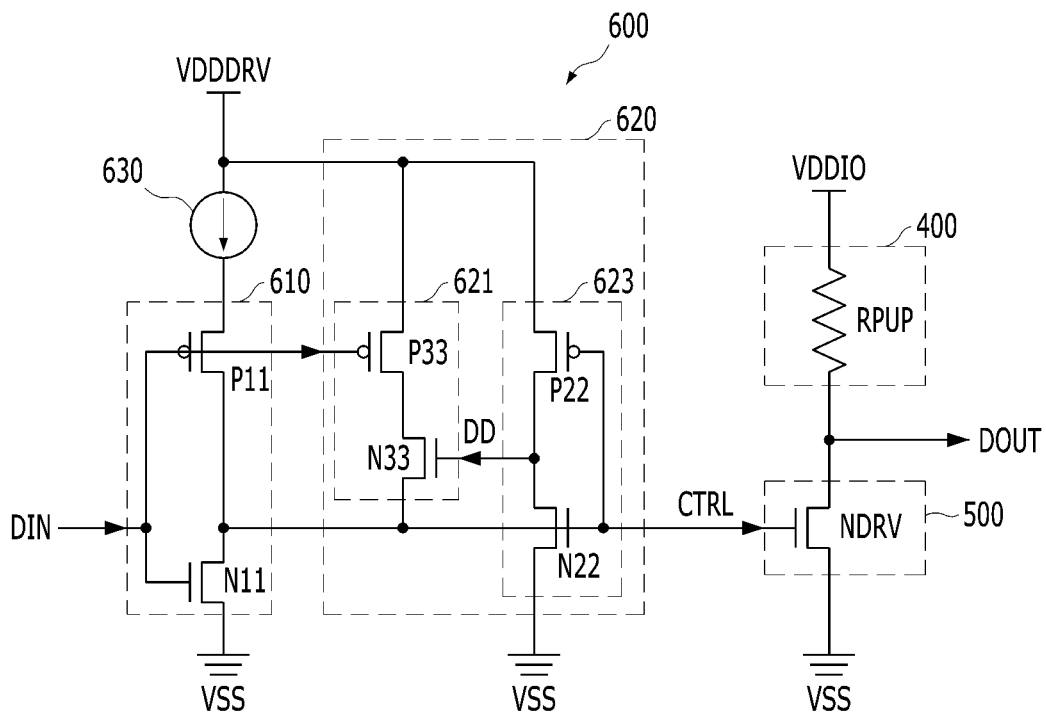
FIG. 4 is a circuit diagram illustrating another example of an electronic device based on an embodiment of the disclosed technology.

FIG. 4 is a circuit diagram illustrating another example of an electronic device according to an embodiment of the disclosed technology.

Referring to FIG. 4, the electronic device may include a resistance element 400, a driving element 500, and a controller 600.

Since the resistance element 400 and the driving element 500 are the same as the resistance element 100 and the driving element 200 described above with reference to FIGS. 1 and 2, detailed descriptions thereof will be omitted.

The controller 600 may include a main driver 610, a sub driver 620, and a current source 630.

Since the main driver 610 and the sub driver 620 are the same as the main driver 310 and the sub driver 320 described above with reference to FIGS. 1 and 2, detailed descriptions thereof will be omitted.

The current source 630 may be coupled between a supply terminal of a second high voltage VDDDRV and the main driver 610. The current source 630 may control the slope of a control signal CTRL more linearly when the main driver 610 drives the control signal CTRL during a first transition period of the control signal CTRL. In other words, since on-resistance (e.g., drain-source on-resistance) of a first driving element P11 included in the main driver 610 is sensitive to process, voltage and temperature (PVT) variations, a current source that is insensitive to the PVT variations such as the current source 630 may be disposed between the first driving element P11 and the second high voltage VDDRDRV, whereby the control signal CTRL may have a constant slope regardless of the PVT variations. Accordingly, during the first transition period of the control signal CTRL, the driving element 500 may be more minutely controlled by the current source 630.

In some embodiments of the disclosed technology, the electronic device can optimize the transition period of the control signal, minimizing the loss of a timing margin while having strong resistance to power noise, electro-magnetic interference (EMI), electrical over-stress (EOS) and the like.

Only specific embodiments and examples for implementing the disclosed technology are described. Other implementations and embodiments are possible based on what is described.

What is claimed is:

1. An electronic device including internal circuitry having an output terminal of an output signal, comprising:
   a resistance element coupled between a supply terminal of a first voltage and the output terminal of the output signal;
   a driving element coupled between the output terminal of the output signal and a supply terminal of a second voltage to selectively drive the output terminal of the output signal based on a control signal; and
   a controller coupled to the driving element provide the control signal generated based on an input signal of the controller to the driving element, the controller driving an output terminal of the control signal with a first driving force during an initial period of a first transition period of the control signal and driving the output terminal of the control signal with a second driving force different from the first driving force during a remaining period of the first transition period,
   wherein the initial period is determined depending on a threshold voltage of the driving element.

2. The electronic device of claim 1, wherein the first driving force is higher than the second driving force.

3. The electronic device of claim 1, wherein the controller includes:
   a main driver to drive the output terminal of the control signal with a third voltage during the first transition period based on the input signal; and
   a sub driver to drive the output terminal of the control signal with the third voltage during the initial period based on the input signal and the control signal, the sub driver being disabled during the remaining period.

4. The electronic device of claim 3,
   wherein the first voltage includes a first high voltage,
   wherein the third voltage includes a second high voltage,
   wherein the first and second high voltages have the same voltage level or different voltage levels.

5. The electronic device of claim 3, wherein the main driver drives the output terminal of the control signal with the second voltage during a second transition period of the control signal.

6. The electronic device of claim 5, wherein the second voltage includes a logic low voltage.

7. The electronic device of claim 3, wherein the controller further includes a current source coupled between a supply terminal of the third voltage and the driving element.

8. An electronic device including internal circuitry having an output terminal of an output signal, comprising:
   a pull-up resistance element coupled between a supply terminal of a first high voltage and the output terminal of the output signal to increase a voltage at the output terminal of the output signal towards the first voltage;
   a pull-down driving element coupled between the output terminal of the output signal and a supply terminal of a low voltage to selectively drive the output terminal of the output signal with the low voltage based on a control signal for the pull-down driving element;
   a main driver coupled between a supply terminal of a second high voltage and the supply terminal of the low voltage to drive an output terminal of the control signal with the second high voltage during a first transition period of the control signal and to drive the output terminal of the control signal with the low voltage during a second transition period of the control signal, based on an input signal of the main driver; and
   a sub driver coupled between the supply terminal of the second high voltage and the supply terminal of the low voltage to drive the output terminal of the control signal with the second high voltage during an initial period of the first transition period, the sub driver being disabled during the remaining period of the first transition period and the second transition period, based on the input signal of the main driver and the control signal for the pull-down driving element.

9. The electronic device of claim 8, wherein the initial period is determined depending on a threshold voltage of the pull-down driving element.

10. The electronic device of claim 8, wherein the first and second high voltages have the same voltage level or different voltage levels.

11. The electronic device of claim 8, wherein the sub driver includes:
    a detection circuit coupled between the supply terminal of the second high voltage and the supply terminal of the low voltage to detect the initial period based on the control signal, the detection circuit generating a detection signal corresponding to a result of the detection; and
    a driving circuit coupled between the supply terminal of the second high voltage and the output terminal of the control signal to drive the output terminal of the control signal with the second high voltage during the initial period based on the input signal and the detection signal.

12. The electronic device of claim 11, wherein the detection circuit includes:
    a first driving element coupled between the supply terminal of the second high voltage and an output terminal of the detection signal to drive the output terminal of the detection signal with the second high voltage based on the control signal; and
    a second driving element coupled between the output terminal of the detection signal and the supply terminal of the low voltage to drive the output terminal of the detection signal with the low voltage based on the control signal.

13. The electronic device of claim 12, wherein a threshold voltage of the second driving element is equal to the threshold voltage of the pull-down driving element.

14. The electronic device of claim 11, wherein the driving circuit includes:
    a first driving element coupled between the supply terminal of the second high voltage and a coupling terminal to drive the coupling terminal with the second high voltage based on the input signal; and
    a second driving element coupled between the coupling terminal and the output terminal of the control signal to drive the output terminal of the control signal with the second high voltage based on the detection signal.

15. The electronic device of claim 8, wherein the main driver includes:
    a first driving element coupled between the supply terminal of the second high voltage and the output terminal of the control signal to drive the output terminal of the control signal with the second high voltage based on the input signal; and
    a second driving element coupled between the output terminal of the control signal and the supply terminal of the low voltage to drive the output terminal of the control signal with the low voltage based on the input signal.

16. The electronic device of claim 8, further comprising a current source coupled between the supply terminal of the second high voltage and the main driver.

17. An operating method of an electronic device including a main driver, a sub driver, a pull-up resistance element, and a pull-down driving element, comprising:

continuously supplying, by the pull-up resistance element, a first high voltage to an output terminal of an output signal regardless of a control signal;

driving, by the main driver and the sub driver, an output terminal of the control signal with a second high voltage during an initial period of a first transition period of the control signal when an input signal transitions from a first voltage level to a second voltage level;

driving, by the main driver, the output terminal of the control signal with the second high voltage during the remaining period of the first transition period of the control signal, and disabling the sub driver when the input signal transitions from the first voltage level to the second voltage level; and driving, by the pull-down driving element, the output terminal of the output signal with a low voltage based on the control signal.

18. The operating method of claim 17, wherein the initial period is determined depending on a threshold voltage of the pull-down driving element.

19. The operating method of claim 17, wherein the first and second high voltages have the same voltage level or different voltage levels.

20. The operating method of claim 17, further comprising:

driving, by the main driver, the output terminal of the control signal with the low voltage during a second transition period of the control signal when the input signal transitions from the second voltage level to the first voltage level; and disabling the pull-down driving element based on the control signal.

* * * * *